(12) United States Patent
Hung et al.

(10) Patent No.: US 8,271,225 B2
(45) Date of Patent: Sep. 18, 2012

(54) TEST SYSTEM FOR CONNECTORS WITH MULTI-INPUT

(75) Inventors: Yung-Cheng Hung, Taipei Hsien (TW);
Wang-Ding Su, Taipei Hsien (TW);
Jui-Hsiung Ho, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 308 days.

(21) Appl. No.: 12/766,999

(22) Filed: Apr. 26, 2010

(65) Prior Publication Data
US 2011/0130999 A1    Jun. 2, 2011

(30) Foreign Application Priority Data
Nov. 27, 2009    (CN) .......................... 2009 1 0310547

(51) Int. Cl.
*H01R 29/00* (2006.01)
*G06F 11/26* (2006.01)

(52) U.S. Cl. ............ 702/117; 702/118; 702/67; 439/43; 439/488; 307/115

(58) Field of Classification Search .................. 702/117, 702/67, 118
See application file for complete search history.

(56) References Cited

U.S. PATENT DOCUMENTS

| | | | | |
|---|---|---|---|---|
| 5,506,851 | A | * | 4/1996 | Fuse .............................. 714/724 |
| 5,621,741 | A | * | 4/1997 | Kohiyama ..................... 714/744 |
| 2010/0036630 | A1 | * | 2/2010 | Ho et al. ......................... 702/67 |

* cited by examiner

*Primary Examiner* — Hal Wachsman
(74) *Attorney, Agent, or Firm* — Altis Law Group, Inc.

(57) ABSTRACT

A test system includes a main selector, a first and a second switching connectors, a first and a second sub-selectors, and a processor. The main selector includes a number of first switches, a number of first contacts, and a number of second contacts. Each sub-selector includes a second switch, a third contact, and a fourth contact. The processor sends a first instruction and a second instruction to correspondingly control the main selector and a selected sub-selector.

3 Claims, 3 Drawing Sheets

TEST SYSTEM FOR CONNECTORS WITH MULTI-INPUT

CROSS-REFERENCES TO RELATED APPLICATIONS

This application claims the priority benefit of China application No. 200910310547.0, filed on Nov. 27, 2009. The entirety of the above-mentioned patent application is hereby incorporated by reference herein and made a part of this specification.

BACKGROUND

1. Technical Field

The present disclosure relates to a test system for connectors.

2. Description of Related Art

Some oscillographs includes four inputs, each of which can test a signal of an apparatus. However, sometimes an apparatus has more than four signals to be tested. If there is a number of apparatuses with more than four signals to be tested, testing will be very troublesome and error prone as an operator must keep track of which outputs have been tested and which ones have yet to be tested on each apparatus.

DETAILED DESCRIPTION

Figure 1:
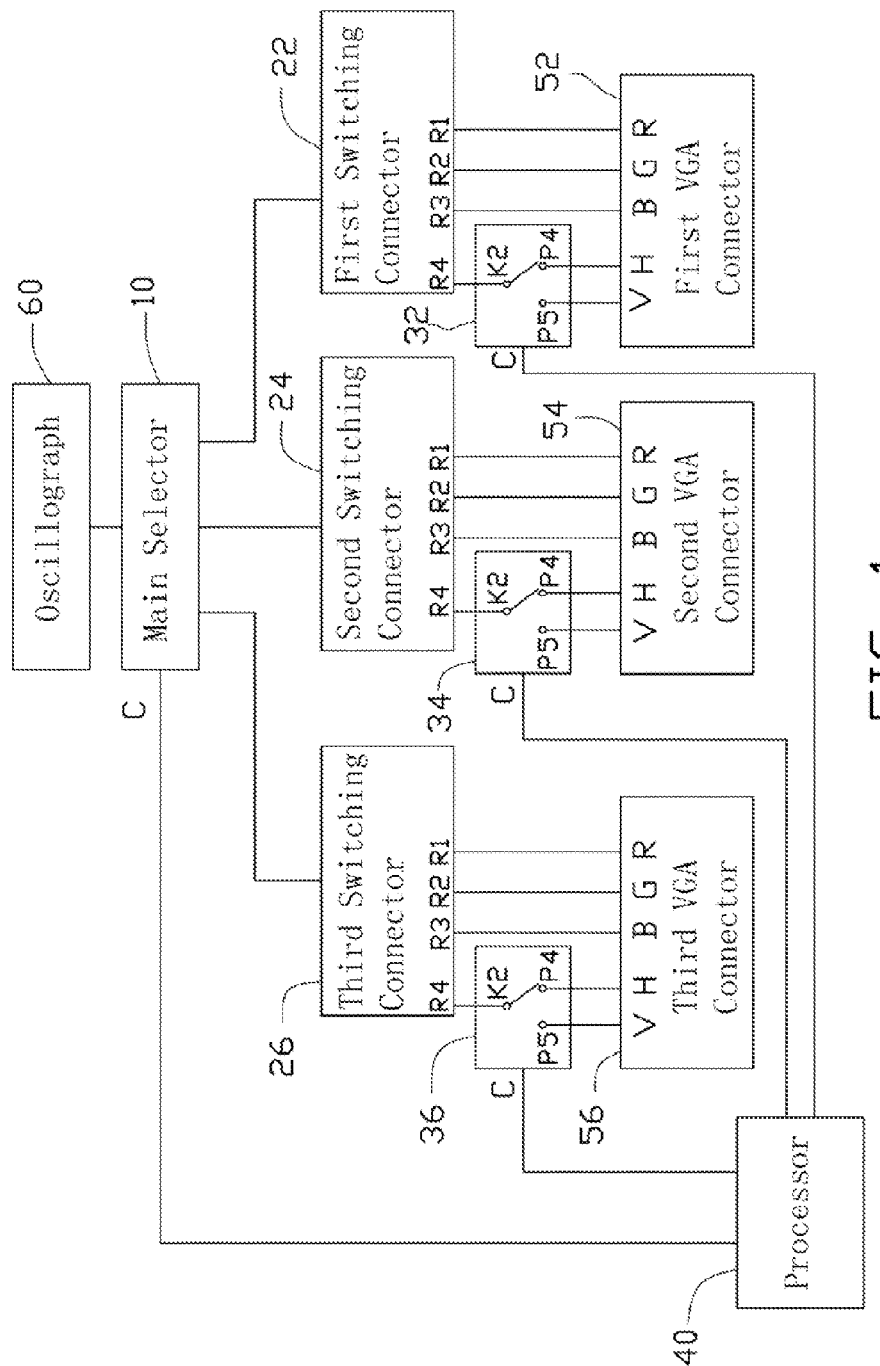
FIG. 1 is a schematic block diagram of an embodiment of a test system, the test system including a main selector, an oscillograph, and a first switching connector.

Referring to FIG. 1, an embodiment of a test system includes a main selector 10, a first switching connector 22, a second switching connector 24, a third switching connector 26, a first sub-selector 32, a second sub-selector 34, a third sub-selector 36, and a processor 40. The test system is used to test a number of apparatuses each having a plurality of signals to be tested. For example, the test system can test a plurality of video graphics array (VGA) connectors each including a red video signal terminal R, a green video signal terminal G, a blue video signal terminal B, a horizontal-sync signal terminal H, and a vertical-sync signal terminal V.

The main selector 10 is connected to an oscillograph 60. The first switching connector 22, the second switching connector 24, and the third switching connector 26 are all connected to the main selector 10.

Figure 2:
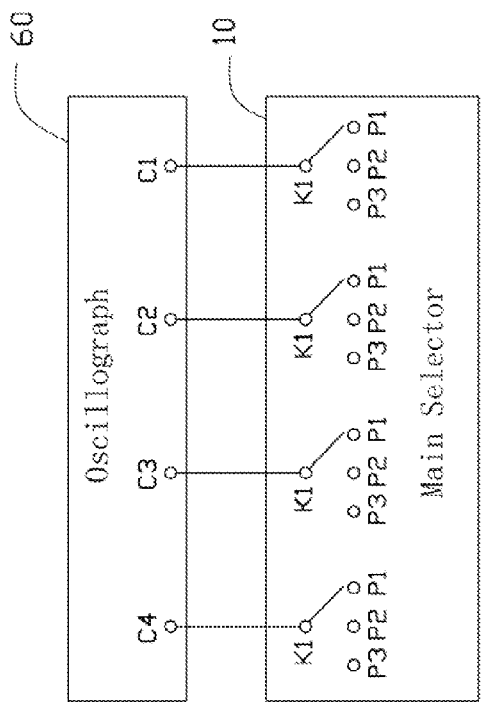
FIG. 2 is a schematic block diagram of the main selector and the oscillograph of FIG. 1.

Referring to FIG. 2, the main selector 10 includes four first switches K1, four first contacts P1, four second contacts P2, and four third contacts P3, and a controlling terminal C (shown in FIG. 1). Each first switch K1 can selectively contact a first contact P1, a second contact P2, or a third contact P3.

The oscillograph 60 includes four inputs C1, C2, C3, and C4. First terminals of the four first switches K1 are correspondingly connected to the four inputs C1, C2, C3, and C4 of the oscillograph 60. Second terminals of the four first switches K1 can simultaneously contact the four first contacts P1, the four second contacts P2, or the four third contacts P3.

Figure 3:
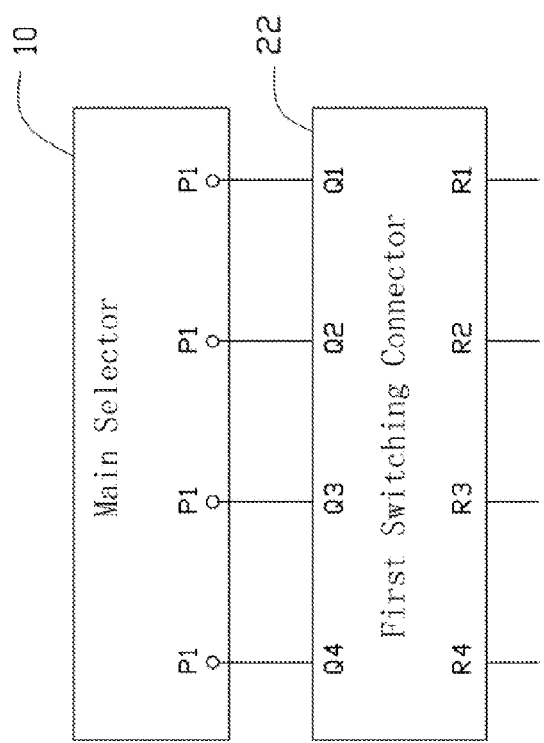
FIG. 3 is a schematic block diagram of the main selector and the first switching connector of FIG. 1.

Referring to FIG. 3, each of the first to third switching connectors 22, 24, and 26 includes a first input R1, a second input R2, a third input R3, a fourth input R4, and four outputs Q1~Q4. The first to fourth inputs R1~R4 are correspondingly connected to the four outputs Q1~Q4.

The four first contacts P1 of the main selector 10 are correspondingly connected to the four outputs Q1~Q4 of the first switching connector 22. Furthermore, the four second contacts P2 of the main selector 10 are correspondingly connected to the four outputs Q1~Q4 of the second switching connector 24, and the four third contacts P3 of the main selector 10 are correspondingly connected to the four outputs Q1~Q4 of the third switching connector 26.

Each of the sub-selectors 32, 34, and 36 includes a second switch K2, a controlling terminal C, a fourth contact P4, and a fifth contact P5. First terminals of the second switches K2 are correspondingly connected to the fourth inputs R4 of the switching connectors 22, 24, and 26. Second terminals of the three second switches K2 can selectively contact a fourth contact P4 or a fifth contact P5.

The processor 40 is connected to the controlling terminals C of the main selector 10 and the sub-selectors 32, 34, and 36. The processor 40 sends a first instruction to the controlling terminal C of the main selector 10, to control the first switches K1 to contact corresponding contacts. The processor 40 also sends a second instruction to a controlling terminal C of the sub-selector 32, 34, or 36, to control a corresponding second switch K2 to contact corresponding contacts.

Before testing a first VGA connector 52, a second VGA connector 54, and a third VGA connector 56, the first inputs R1 of the switching connectors 22, 24, and 26 are correspondingly connected to the red video signal terminals R of the VGA connectors 52, 54, and 56. The second inputs R2 of the switching connectors 22, 24, and 26 are correspondingly connected to the green video signal terminals G of the VGA connectors 52, 54, and 56. The third inputs R3 of the switching connectors 22, 24, and 26 are correspondingly connected to the blue video signal terminals B of the VGA connectors 52, 54, and 56. The fourth contacts P4 of the sub-selectors 32, 34, and 36 are correspondingly connected to the horizontal-sync signal terminals H of the VGA connectors 52, 54, and 56. The fifth contacts P5 of the sub-selectors 32, 34, and 36 are correspondingly connected to the vertical-sync signal terminals V of the VGA connectors 52, 54, and 56.

The first instruction of the processor 40 includes a first binary code. When the first binary code of the first instruction is "00", the processor 40 controls the four first switches K1 simultaneously to contact the four first contacts P1 and the first sub-selector 32 is selected. The test system thus selects the first VGA connector 52 to test.

The processor 40 then sends a second instruction including a second binary code to the first sub-selector 32. When the second binary code of the second instruction is "00", the processor 40 controls the second switch K2 of the first sub-selector 32 to contact the fourth contact P4 of the first sub-selector 32. The test system tests signals of the red video signal terminal R, the green video signal terminal G, the blue video signal terminal B, and the horizontal-sync signal terminal H of the first VGA connector 52.

The processor 40 adds "1" to the second binary code of the second instruction after the test system tests the signals of the red video signal terminal R, the green video signal terminal G, the blue video signal terminal B, and the horizontal-sync signal terminal H of the first VGA connector 52. The second binary code of the second instruction is "01", the processor 40 controls the second switch K2 of the first sub-selector 32 to contact the fifth contact P5 of the first sub-selector 32. The test system tests a signal of the vertical-sync signal terminal V of the first VGA connector 52.

The processor 40 adds "1" to the first binary code of the first instruction after the test system tests all of the signals of the first VGA connector 52. The first binary code of the first instruction is "01", the processor 40 controls the four first switches K1 of the main selector 1 to simultaneously contact the four second contacts P2 and the second sub-selector 34 is selected. Thus the test system selects the second VGA connector 54 to test.

Similarly, when the first binary code of the first instruction is "10", the processor 40 controls the four first switches K1 of the main selector 1 simultaneously to contact the four third contacts P3 and the third sub-selector 36 is selected. Thus the test system selects the third VGA connector 56 to test.

The foregoing description of the exemplary embodiments of the disclosure has been presented only for the purposes of illustration and description and is not intended to be exhaustive or to limit the disclosure to the precise forms disclosed. Many modifications and variations are possible in light of the above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A test system, comprising:

a main selector comprising a plurality of first switches, a plurality of first contacts, and a plurality of second contacts, wherein a first terminal of each first switch is connected to an input of an oscillograph, a second terminal of each first switch can selectively contact one of the plurality of first contacts or one of the plurality of second contacts;

a first and a second switching connectors each comprising a plurality of inputs and a plurality of outputs, wherein each output of the first switching connector is connected to a corresponding first contact of the main selector, each output of the second switching connector is connected to a corresponding second contact of the main selector;

a first and a second sub-selectors each comprising a second switch, a third contact, and a fourth contact, wherein a first terminal of the second switch of the first sub-selector is connected to an input of the first switching connector, a second terminal of the second switch of the first sub-selector can selectively contact the third or the fourth contact of the first sub-selector, a first terminal of the second switch of the second sub-selector is connected to an input of the second switching connector, a second terminal of the second switch of the second sub-selector can selectively contact the third or the fourth contact of the second sub-selector, a plurality of terminals of a first apparatus to be tested are correspondingly connected to the other inputs of the first switching connector, the third and the fourth contacts of the first sub-selector, a plurality of terminals of a second apparatus to be tested are correspondingly connected to the other inputs of the second switching connector, the third and the fourth contacts of the second sub-selector; and a processor connected to the main selector, and the first and the second sub-selectors, wherein the processor sends a first instruction to control the first switches of the main selector to contact the first contacts or the second contacts and select a corresponding sub-selector, the processor also sends a second instruction to control the second switch of the selected sub-selector to contact the third or the fourth contact.

2. The test system of claim 1, wherein the second instruction comprises a binary code, the processor adds "1" to the binary code if some terminals of the apparatus have been tested, and there is at least one terminal of the apparatus has not been tested yet.

3. The test system of claim 1, wherein the first instruction comprises a binary code, the processor adds "1" to the binary code if an apparatus has been tested, and the other apparatus has not been tested yet.

* * * * *